United States Patent [19]

Schmidt et al.

[11] Patent Number: 5,612,577
[45] Date of Patent: Mar. 18, 1997

[54] SYMMETRICAL CIRCUIT CONNECTION BOARD FOR VEHICLE APPLICATION

[75] Inventors: Robert M. Schmidt, Livonia; John R. Cranick, White Lake, both of Mich.

[73] Assignee: United Technologies Automotive, Inc., Dearborn, Mich.

[21] Appl. No.: 514,409

[22] Filed: Aug. 11, 1995

[51] Int. Cl.$^6$ ...................................................... H05K 1/02
[52] U.S. Cl. ........................... 307/10.1; 180/322; 361/794
[58] Field of Search .................................... 307/9.1, 10.1, 307/147; 200/5 R; 361/748, 784, 728, 794; 180/321–323

[56] References Cited

U.S. PATENT DOCUMENTS

| | | | |
|---|---|---|---|
| 4,473,724 | 9/1984 | Suzuki | 200/5 R |
| 5,128,500 | 7/1992 | Hirschfeld | 200/5 R |
| 5,442,149 | 8/1995 | Sato | 200/5 R |
| 5,513,077 | 4/1996 | Stribel | 361/794 |

*Primary Examiner*—Richard T. Elms
*Attorney, Agent, or Firm*—Howard & Howard

[57] ABSTRACT

An improved symmetric circuit connection board may be utilized on both the driver and passenger sides of a vehicle or in left and right-hand orientations. In the past, two distinct boards have been provided for use on the driver and passenger sides. The inventive symmetric boards includes central circuit stampings surrounded by a molded body. Openings extend symmetrically, through the molded body to the circuit stampings such that the assembler may selectively place one opposed face of the board facing outwardly and connect the board as appropriate. Should the board be utilized on the other side of the vehicle, the opposed face of the board faces outwardly for connection. The symmetric board may thus be utilized for either left or right hand side applications in a vehicle.

17 Claims, 3 Drawing Sheets

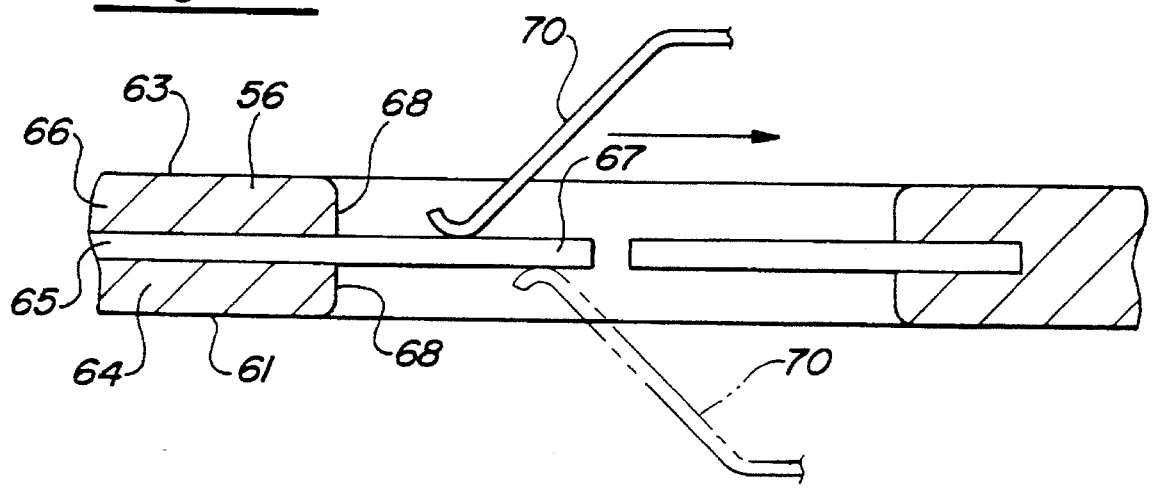
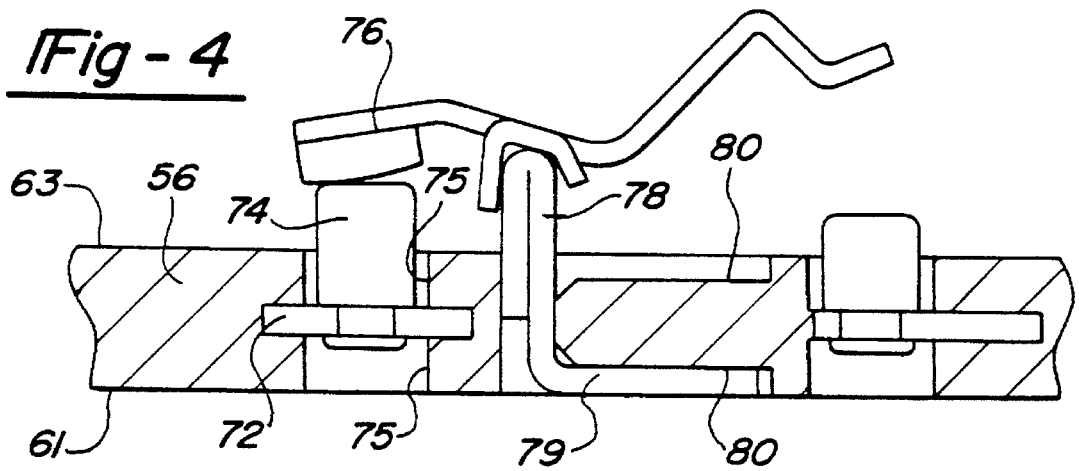

SYMMETRICAL CIRCUIT CONNECTION BOARD FOR VEHICLE APPLICATION

BACKGROUND OF THE INVENTION

This invention relates to a symmetric circuit board which can be utilized on either the driver and passenger side of a vehicle.

Circuit boards are utilized to facilitate electrical connections in vehicle applications. As one example, circuit boards facilitate connections between switch members, and the wires leading to the motors or other accessories that might be controlled by the switches. The circuit boards are typically mounted in the dash, the doors or in seats for the vehicle.

In many vehicle applications, there may be similar switching requirements on both the driver and passenger seats and doors. The switches preferably are in corresponding positions on both the driver and passenger seats and doors, and the positioning of the switch members is opposite for the driver application and the passenger application.

For the above applications, the prior art has typically made two parts, with a first part being utilized to provide the connections for the driver's side, and a second part manufactured to provide the connections for the passenger side. This has required the preparation of two sets of tooling for each part that will be utilized on both the driver and passenger sides.

In addition, vehicles are now being manufactured for both United States and foreign use. To this end, electrical connections in the dash of the vehicle might also have opposed required positioning for left and right side driving. As an example, a control for a driver of a U.S. vehicle might be on the left side of the dash board, and have a first orientation, while a control for the driver of a foreign-bound vehicle would be on the right side of the dash and have a second orientation opposite from the first orientation. Again, two sets of tools have typically been required to manufacture the two separate pans. While this requirement is not burdensome for simple molded pans, it is burdensome to make two of the relatively complex circuit connection boards.

Moreover, there are many switches where similar switch bodies are mounted on both the right and left-hand side of a steering wheel. As one example, the front and rear wiper/wash switch for all terrain vehicles are similar and mounted on both the right and left sides of the steering wheel. These switches have typically required two distinct circuit boards to provide the two switches.

SUMMARY OF THE INVENTION

In a disclosed embodiment of this invention, a single planar circuit connection board is formed symmetrically. Each of the areas where a connection may be made are symmetric on each side of a central plane of the circuit board. In this way, the single circuit board can be utilized for both driver and passenger, or right and left side applications. Only a single set of tools need be manufactured and utilized. An assembler must merely properly align the symmetric circuit board with the particular required position, and thus can complete the necessary connections.

In a disclosed embodiment of this invention, the symmetric circuit connection board includes circuit element stampings placed approximately at a mid-section plane of the circuit board. Plastic is molded around the stampings. Openings are formed through the plastic to provide for contact on the stampings. The openings are preferably generally symmetric on both sides of the stamping. Thus, an assembler may utilize either one face or the other of the circuit board as necessary for the particular assembly application. A single circuit board can be utilized on both passenger and driver side application, or for foreign and U.S. applications as outlined above.

These and other features of this invention will be best understood from the following specification and drawings, the following of which is a brief description.

BRIEF DESCRIPTION OF THE DRAWINGS

FIG. 3 is a cross section through a first portion of a circuit board according to the present invention.

FIG. 4 is a cross section through another portion of an inventive circuit board according to this invention.

DETAILED DESCRIPTION OF A PREFERRED EMBODIMENT

Figure 1A:
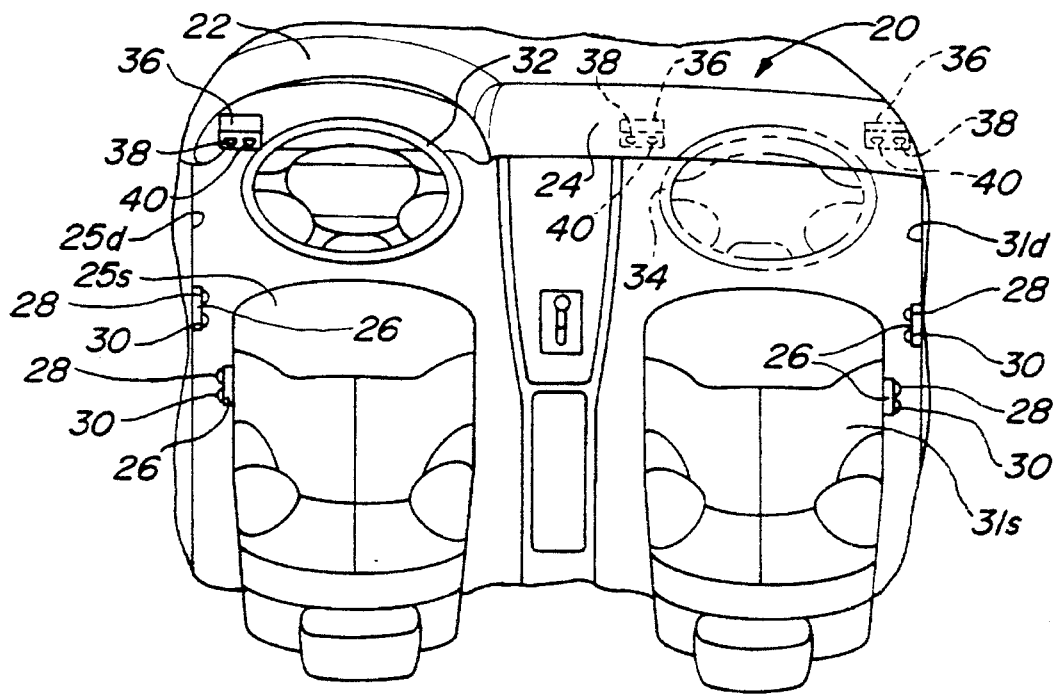
FIG. 1A shows a simplified view of a vehicle incorporating the inventive circuit board.

A vehicle 20 incorporating an inventive circuit connection board is illustrated in FIG. 1A. Vehicle 20 has a driver side 22 and a passenger side 24. A seat 25s or door 25d on the driver side mounts a switch 26. As an example, switch 26 may incorporate two separate switches, 28 and 30. Switch 28 is more forward than switch 30. At the same time, the passenger seat 31s or door 31d incorporates an identical switch 26 with the switch member 28 mounted forwardly of the switch member 30. In the past, providing this orientation of the switches 28 and 30 would have required two separate and distinct circuit connection boards for the switches mounted to the seats or doors 25 and 31. The inventive circuit board overcomes this requirement.

The two switches 28 and 30 and their positions are illustrated to explain the problem in the prior art. The detail of any switch forms no portion of this invention.

Another application of the inventive circuit board is illustrated relative to the steering wheels 32 and the steering wheel 34 shown in phantom on the right hand side of vehicle 20. A switch 36, again having two switch members 38 and 40, with switch 38 positioned outwardly from switch 40 is illustrated adjacent to both steering wheels 32 and 34. Again, the prior art has typically required two distinct circuit boards to be manufactured. The steering wheel 34 and switch 36 on the right hand side of FIG. 1A would be the driver side in foreign applications, and thus, it would be desirable to make a single circuit board for the switch 38 which could be utilized adjacent to either vehicle drive positioning as illustrated in FIG. 1A. The present invention provides this single type of circuit board. The same benefits arise with door-mounted operator switches such as window and mirror adjustment switches.

Also, switches 36 are shown mounted symmetrically on both the right and left-hand side of steering wheel 34. These switches might be used for switching applications such as rear and front wipers. The same requirement could arise with a left side steering wheel.

Figure 1B:
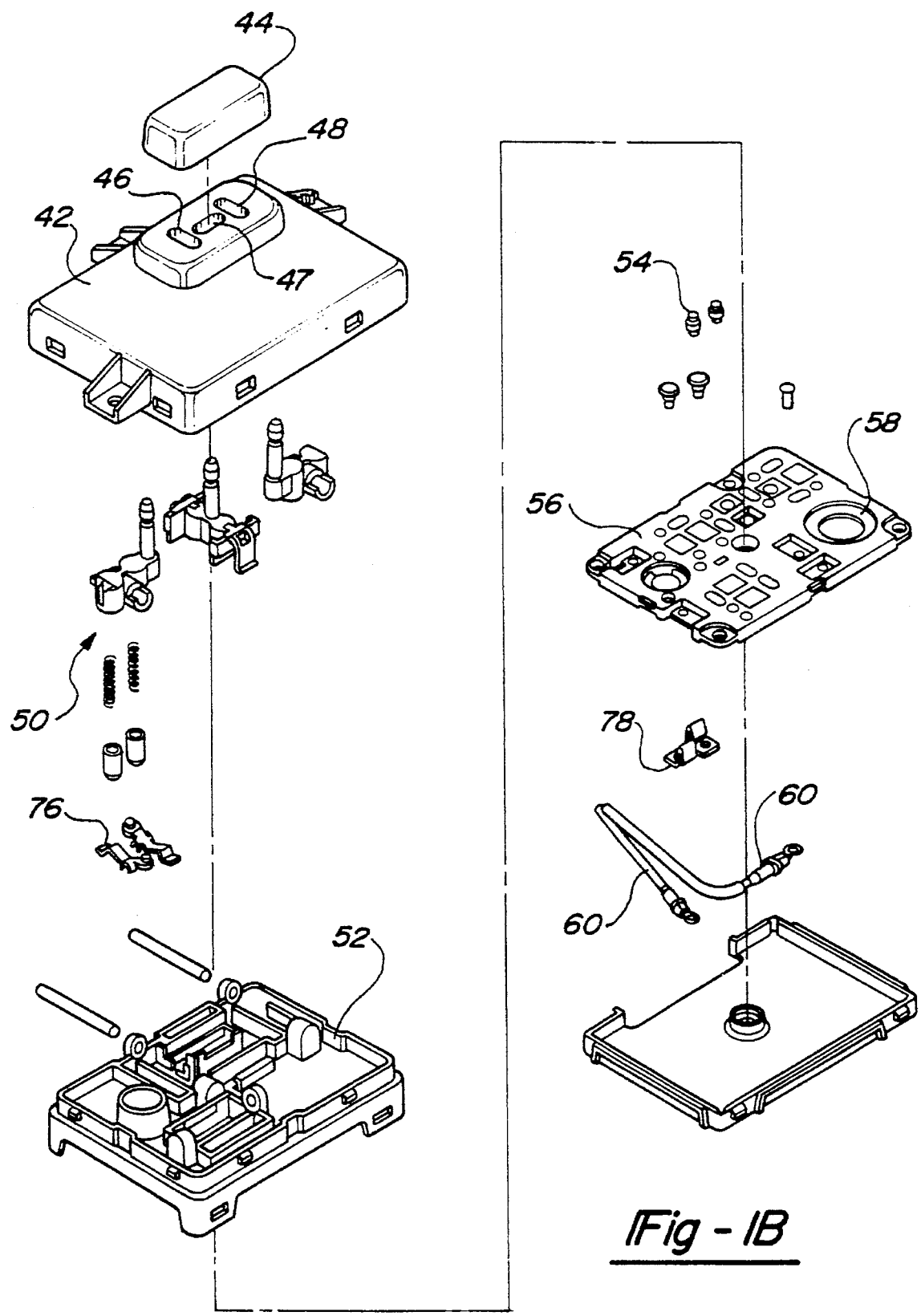
FIG. 1B shows an exploded view of a typical switch assembly.

FIG. 1B shows a typical switch housing 42 incorporating a switch 44. Switch 44 is shown in a particular corner of the housing 42, and includes openings 46, 47 and 48. Circuit elements 50 for completing the circuits extend through the openings 46, 47 and 48. A plate 52 mounts the circuit elements 50, and switch contact connectors 54 are mounted within a circuit connection board 56. The aspects of the switch 42 other than connection board 56 form no part of this invention. Board 56 includes circuit stampings 58 which selectively complete circuits between the switch element 44 and wire leads 60.

As stated above, this invention does not relate to any structure of the switch, but rather is directed to structure of the circuit board 56. Switch 44 is shown to have a forward position relative to the remainder of the switch body 42 that would require there to be two separate circuit boards 56, with one for the driver side and one for the passenger side. This is similar to the situation illustrated in FIG. 1A where there is a distinct forward portion for the two sides of the switches that would require two separate circuit boards. The housing 42 is a simple molded part that is easily made for each application. Many of the other circuit components can be used for each side. It is only the circuit board 56, which is non-symmetric about a center axis of its face, which requires two complex separate pans.

Figure 2A:
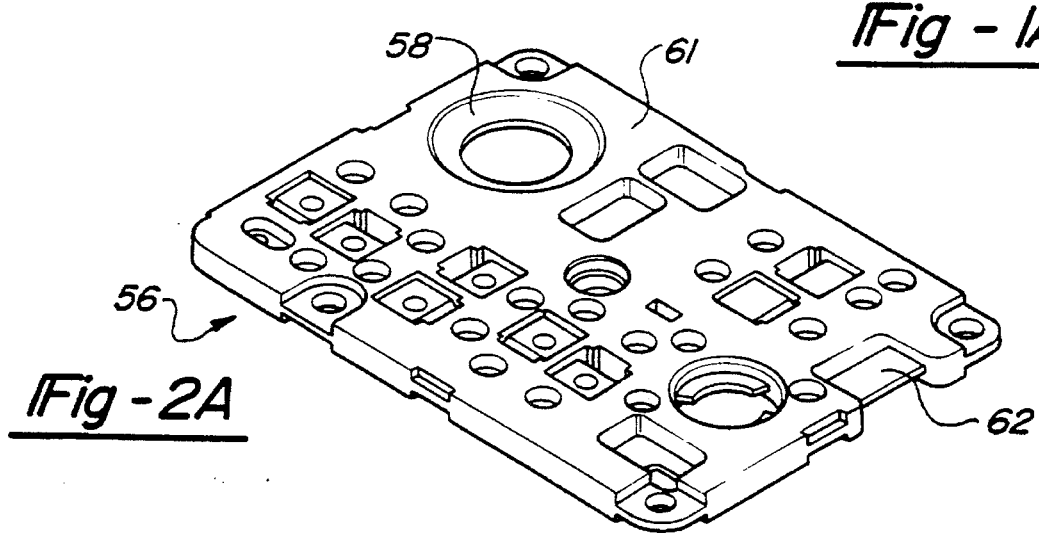
FIG. 2A shows a first face of an inventive circuit board.

FIG. 2A shows a first face 61 of circuit board 56. Face 61 incorporates many circuit stampings 58, 62, and other connections.

Figure 2B:
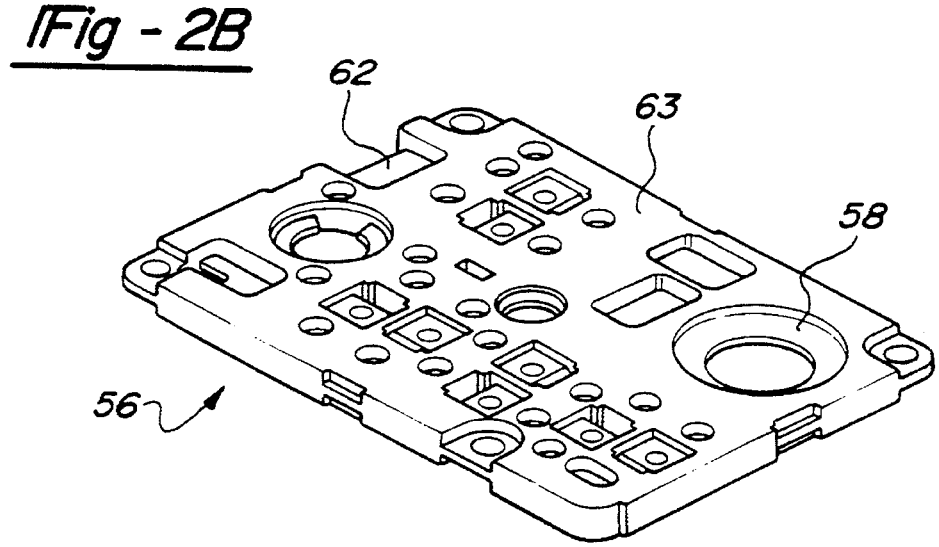
FIG. 2B shows a second face of the inventive circuit board.

The board shown in FIGS. 2A and 2B have symmetric openings, through the width of the board such that the board can be utilized with either face 61 or face 63 completing the electric contacts. This feature will be best understood from FIGS. 3 and 4.

As shown in FIG. 3, circuit board 56 incorporates a plastic side 64 forming face 61, a central circuit stamping 65, and opposed plastic side 66 forming face 63. Exposed portions 67 of the stamping 65 are provided by openings 68 which are symmetric and extend to both faces 61 and 63. In the portion of the circuit board 56 illustrated in FIG. 3, the stamping portion 67 is contacted by a sliding contact 70. Should the same circuit be utilized on the opposed side of a vehicle, then the sliding contact 70 would be at the position shown in phantom in FIG. 3.

As shown in FIG. 4, the stamping 72 could be formed within the plastic molding and mount a contact 74. A bore 75 is symmetric on both sides of the stamping 72 such that contact 74 could be mounted extending to face 61 rather than face 63.

In this example, a rocker switch 76 mounts a yoke 78 mounted within a well 80. Well 80 is formed symmetric on both faces 61 and 63 such that the switch could also be mounted on the opposed face.

Now, referring back to FIG. 1A, when the inventive circuit board is utilized on a driver side application, face 63 may face outwardly from the left hand side of the seat as illustrated in FIG. 1A. In the passenger side application, face 61 would face outwardly, or to the right hand side of the FIG. 1A. Since the board 56 is symmetric, the single board can provide the circuit board connections at both sides. Similarly, a single board could be utilized and mounted in the door of both passenger and driver side. Also, a single board could be utilized to provide either a left hand or a right hand side dash mounted driver switch (or both) as is necessary for the intended location of the vehicle. Also, there are switch applications where switches for different functions are mounted on the left and right-hand side of the steering wheel, where the switch structure is symmetrically opposite. These applications will also benefit from this invention.

In preferred embodiments, the circuit board includes copper stamping surrounded by molded plastic.

Although a preferred embodiment of this invention has been disclosed, a worker of ordinary skill in the art would recognize that certain modifications would come within the scope of this invention. For that reason, the following claims should be studied to determine the true scope and content of this invention.

We claim:

1. A circuit connection board for use in a vehicle comprising:

a central planar circuit portion having opposed faces to be contacted by electrical contact members; and a body surrounding said circuit portion, said body including openings extending to said circuit portion to provide access to said circuit portion for connection of electrical contact members, said circuit portion mounted at an approximate midsection of said body, and said openings extending from each of said opposed faces of said circuit portion to opposed faces of said body, such that portions of both of said opposed faces of said central planar circuit portion are exposed for contact by said electrical contact members and such that either of said opposed faces of said body can be placed outwardly for selective use in one of two sides of a vehicle.

2. A circuit board as recited in claim 1, wherein said circuit board is utilized in a switch application.

3. A circuit board as recited in claim 2, wherein said circuit board includes sliding contacts on one of said exposed portions of said circuit portion.

4. A circuit board as recited in claim 2, wherein a rocker switch contacts one of said exposed portions of said circuit portion.

5. A circuit board as recited in claim 4, wherein a yoke is mounted within a well in one face of said body, a symmetrical well formed on the opposed face of said circuit board from the face which mounts said yoke.

6. A circuit board as recited in claim 2, wherein said circuit board is mounted on the seat of a vehicle.

7. A circuit board as recited in claim 2, wherein said circuit board is mounted in the dash of a vehicle on either the left hand or right hand side of the vehicle.

8. A circuit board as recited in claim 2, wherein said circuit board is mounted in a door of a vehicle.

9. A circuit board as recited in claim 1, wherein said body is molded from a plastic.

10. A circuit board as recited in claim 1, wherein there are a plurality of said circuit portions with corresponding openings.

11. A vehicle comprising:

a vehicle body having left and right hand sides defined when facing forwardly in a forward direction of travel of said vehicle;

an electric connection board mounted on one of said left and right hand sides of said vehicle, said board having at least a plurality of electric contacts, said circuit board having a pair of opposed faces, said opposed faces formed generally symmetrical about a central plane of said board such that one of said opposed faces is placed in a particular orientation for mounting on said right hand side of said vehicle, and the other of said opposed faces is mounted in an opposed orientation when said board is mounted on a left hand side of said vehicle; and said board including circuit stampings mounted at an approximately center of said circuit board, said circuit stampings having opposed faces to be contacted by said electric contacts, and having a molded body surrounding said circuit stampings, said molded body including openings extending to said circuit stampings, and said openings being generally symmetric and extending to both of said opposed faces of said circuit stampings such that portions of both said opposed faces of said circuit stampings are exposed for contact by said electric contacts.

12. A vehicle as recited in claim 11, wherein there are boards mounted on both said left and right hand sides of said vehicle with one of said opposed faces facing outwardly on said left side and the other of said opposed faces being utilized to face outwardly on said right side.

13. A vehicle as recited in claim 12, wherein said opposed boards are mounted in the driver and passenger seats of said vehicle.

14. A vehicle as recited in claim 11, wherein said vehicle includes said board mounted on only one of said left and right hand sides of said vehicle.

15. A vehicle as recited in claim 14, wherein said board is mounted in a dash of said vehicle.

16. A vehicle as recited in claim 11, wherein said board is mounted in the door of said vehicle.

17. A vehicle as recited in claim 11, wherein said molded body is formed of a plastic.

* * * * *